US009355923B2

United States Patent
Yoshino

(10) Patent No.: US 9,355,923 B2
(45) Date of Patent: May 31, 2016

(54) SEMICONDUCTOR DEVICE WITH AN OVERLAY MARK INCLUDING SEGMENT REGIONS SURROUNDED BY A POOL REGION

(71) Applicant: Micron Technology, Inc., Boise, ID (US)

(72) Inventor: Hiroshi Yoshino, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/523,056

(22) Filed: Oct. 24, 2014

(65) Prior Publication Data
US 2015/0130031 A1    May 14, 2015

(30) Foreign Application Priority Data
Nov. 14, 2013    (JP) .................. 2013-236071

(51) Int. Cl.
*G03F 7/26* (2006.01)
*H01L 21/66* (2006.01)
*G03F 7/20* (2006.01)
*H01L 27/108* (2006.01)

(52) U.S. Cl.
CPC ............ *H01L 22/30* (2013.01); *G03F 7/70633* (2013.01); *H01L 27/10885* (2013.01); *H01L 2924/0002* (2013.01)

(58) Field of Classification Search
CPC ..................... G03F 7/70633; G03F 7/70683
See application file for complete search history.

(56) References Cited

U.S. PATENT DOCUMENTS

| 8,330,281 B2 | 12/2012 | Ghinovker et al. | |
|---|---|---|---|
| 2007/0229829 A1* | 10/2007 | Kandel | G03F 7/70633 356/401 |
| 2010/0062548 A1* | 3/2010 | Kwon | G03F 7/70633 438/7 |

FOREIGN PATENT DOCUMENTS

| JP | H10-125751 | 5/1998 |
|---|---|---|
| JP | 2012-134378 | 7/2012 |

* cited by examiner

*Primary Examiner* — Daniel Shook
(74) *Attorney, Agent, or Firm* — Wells St. John, P.S.

(57) ABSTRACT

Disclosed herein is a semiconductor device that includes a plurality of segment regions arranged with a first distance, each of segment regions including a plurality of first grooves arranged with a second distance that is smaller than the first distance, and a second groove enclosing the plurality of the segment regions with a third distance that is larger than the second distance. The third distance may be substantially equal to the first direction.

16 Claims, 15 Drawing Sheets

SEMICONDUCTOR DEVICE WITH AN OVERLAY MARK INCLUDING SEGMENT REGIONS SURROUNDED BY A POOL REGION

This application is based upon and claims the benefit of priority from Japanese Patent Application No. 2013-236071 filed on Nov. 14, 2013, the disclosure of which are incorporated herein in its entirely by reference.

BACKGROUND

1. Field of the Invention

This invention relates to semiconductor devices, and more specifically to an overlay mark including segment regions and a pool region.

2. Description of Prior Art

A DRAM (Dynamic Random Access Memory), which is a typical semiconductor memory device, is manufactured in the following manner. First, on a semiconductor wafer, a world-line structure is formed on a semiconductor substrate. Subsequently, an intermediate insulating layer deposited on the semiconductor substrate is patterned via a photoresist to form a bit-line contact. To align the bit-line contact with the word-line structure, an overlay mark of the word-line structure is formed on the semiconductor substrate and that of the bit-line contact is formed by the photoresist. The overlay mark of the photoresist (hereinafter "upper level pattern") is formed with the patterning of the photoresist for the bit-line contact. If the upper level pattern is misaligned to the overlay mark formed on the semiconductor substrate (hereinafter "an element set") then the photoresist of the upper level pattern is reworked after stripped it. Before the intermediate insulating layer is etched via the photoresist, an alignment between the upper level and the lower level is performed to prevent misalignment of the word-line structure and bit-line contact.

An AIM (Advanced Imaging Metrology) mark (U.S. Pat. No. 8,330,281 B2), BiB (Bar in Bar) mark (Japanese Patent Application Laid Open No. 1998-125751), etc as the overlay mark are well-known. In the multi-patterning techniques (Japanese Patent Application Laid Open No. 2012-134378), such as SADP (Self Aligned Double Patterning), an extra, isolated groove (hereinafter "single groove") is formed around a segment region including periodical grooves (trenches). The single groove is undesirable to deteriorate a measurement accuracy of the overlay mark in the alignment process.

SUMMARY

The disclosure provides a semiconductor device that includes a plurality of segment regions arranged with a first distance, each of the segment regions including a plurality of first grooves arranged with a second distance that is smaller than the first distance, and a second groove enclosing the plurality of the segment regions with a third distance that is larger than the second distance.

The disclosure further provides a semiconductor device that includes a first groove (e.g., the left-most vertically extending segment of groove 118 along direction y in FIG. 6), a first set (e.g., the set within segment region 106a as shown in FIG. 5) of second grooves (e.g., grooves 116 within segment region 106a as shown in FIG. 5) which is apart from the first groove with a first distance (e.g., the distance along direction x from the left-most vertically extending segment of groove 118 [along direction y] to the left-most edge of segment region 106a as shown in FIG. 6), the second grooves being arranged periodically with a second distance (e.g., distance W2 in FIG. 5) that is smaller than the first distance, a second set (e.g., the set within segment region 106b as shown in FIG. 5) of third grooves (e.g., grooves 116 in segment region 106b as shown in FIG. 5) which is apart from the first set with a third distance (e.g., the distance along direction x from the right-most edge of segment region 106a to the left-most edge of segment region 106b as shown in FIG. 6) that is larger than the second distance, the third grooves being arranged periodically with a fourth distance (e.g., distance W2 in FIG. 5) that is substantially equal to the first second distance, and a fourth groove (e.g., the right-most vertically extending segment of groove 118 along direction y in FIG. 6) that is apart from the second set with a fifth distance (e.g., the distance alone direction x from the right-most edge of segment region 106b to the right-most vertically extending segment of groove 118 [along direction y] as shown in FIG. 6) that is larger than the second distance.

The disclosure still further provides a semiconductor device that includes first and second segment regions each including a plurality of first grooves that are arranged periodically with a first distance, the first and second segment regions arranged with a second distance that is no less than the first distance, and a pool region including a second groove that surrounds the first and second segment regions with a third distance, the third distance being no less than the second distance.

DETAILED DESCRIPTION OF THE INVENTION

Preferred embodiments of the present invention will hereinafter be described in detail, referring to the accompanying drawings.

Figure 4:
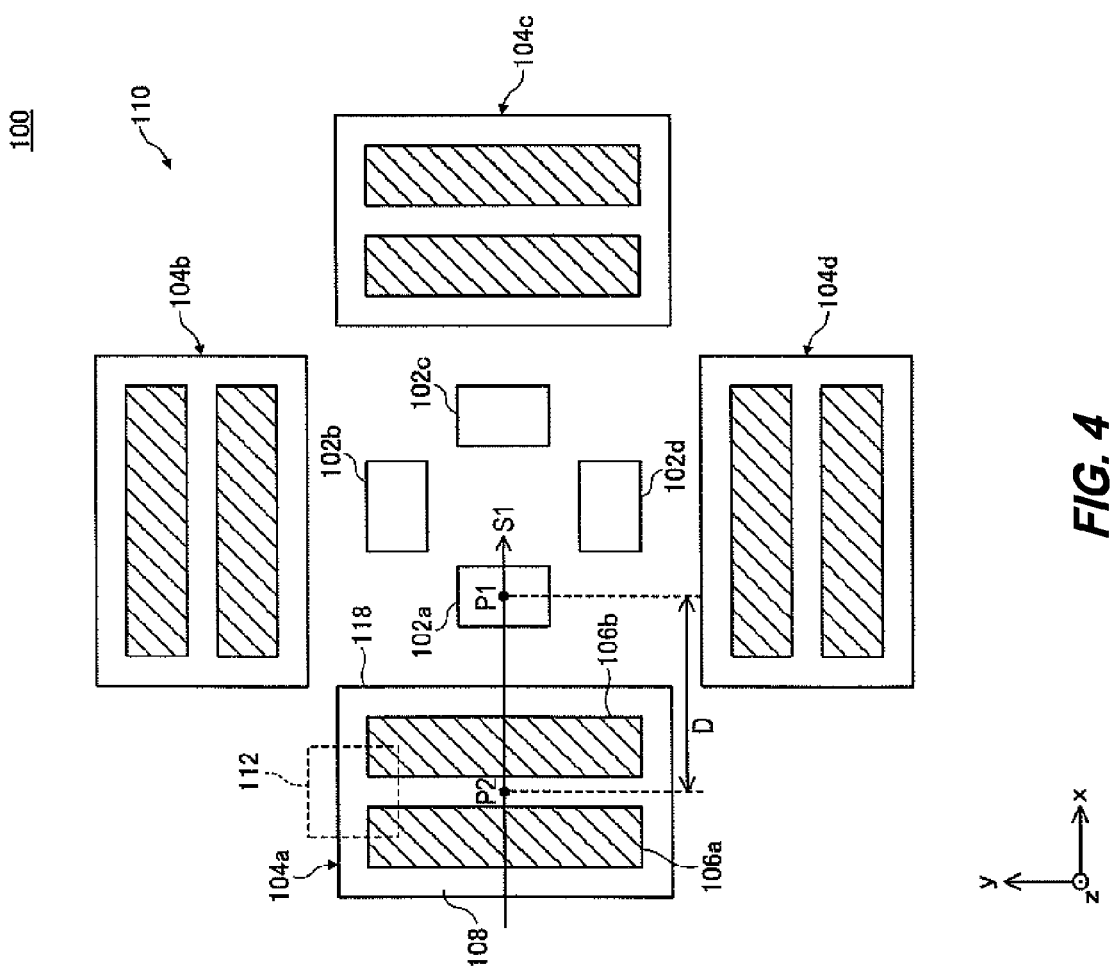
FIG. 4 is a plan view of an overlay mark in the semiconductor device in accordance with an embodiment of the invention.

FIG. 4 is a plan view of an overlay mark 110 formed on a semiconductor device 100 according to a first embodiment. In this embodiment, the semiconductor device 100 is described as a DRAM integrated in a single semiconductor chip. The overlay mark 110 includes element sets 104a to 104d formed on a lower layer, such as a semiconductor substrate, and upper level patterns 102a to 102d formed temporarily in a photoresist, which is an upper layer above the semiconductor substrate.

The overlay mark 110 in the first embodiment is a so-called BiB mark. The upper level patterns 102a to 102d in the first embodiment are formed as rectangular areas in the photoresist and are arranged in such a manner as shown in FIG. 4. The element set 104a is a rectangular area with long sides extending in the y direction and includes two segment regions 106a and 106b (first and second segment regions) with long sides extending in the y direction. The element set 104a is a mark corresponding to the upper level pattern 102a. The other element sets 104b to 104d correspond to the upper level patterns 102b to 102d, respectively, and have the same structure as the element set 104a. The upper level pattern 102a and the upper level pattern 102c adjacent to each other in the x direction are the same in their long-side directions, and the upper level pattern 102b and the upper level pattern 102d are also the same in their long-side directions. One element set 104 may include three or more segment regions 106.

In the manufacturing process for the semiconductor device 100, a plurality of the semiconductor devices 100 are formed on a wafer. Before the wafer is diced into individual pieces of semiconductor devices 100, the element set 104 is formed together with a lower layer structure, such as a word-line structure. Subsequently, a photoresist is coated and is patterned by a lithography exposure system. During the patterning, the upper level pattern 102 is formed in the photoresist. A measurement tool scans the formed patterns in the x-positive direction (direction of an arrow S1) to detect the midpoint P2 of the element set 104a and the midpoint P1 of the upper level pattern 102a, thereby measures the distance D between the midpoints P1 and P2. The extent of misalignment between the upper level pattern 102a and element set 104a can be determined by the distance D. This measurement method applies also to misalignment measurement in other three directions (x-negative direction, y-positive direction, y-negative direction).

Figure 5:
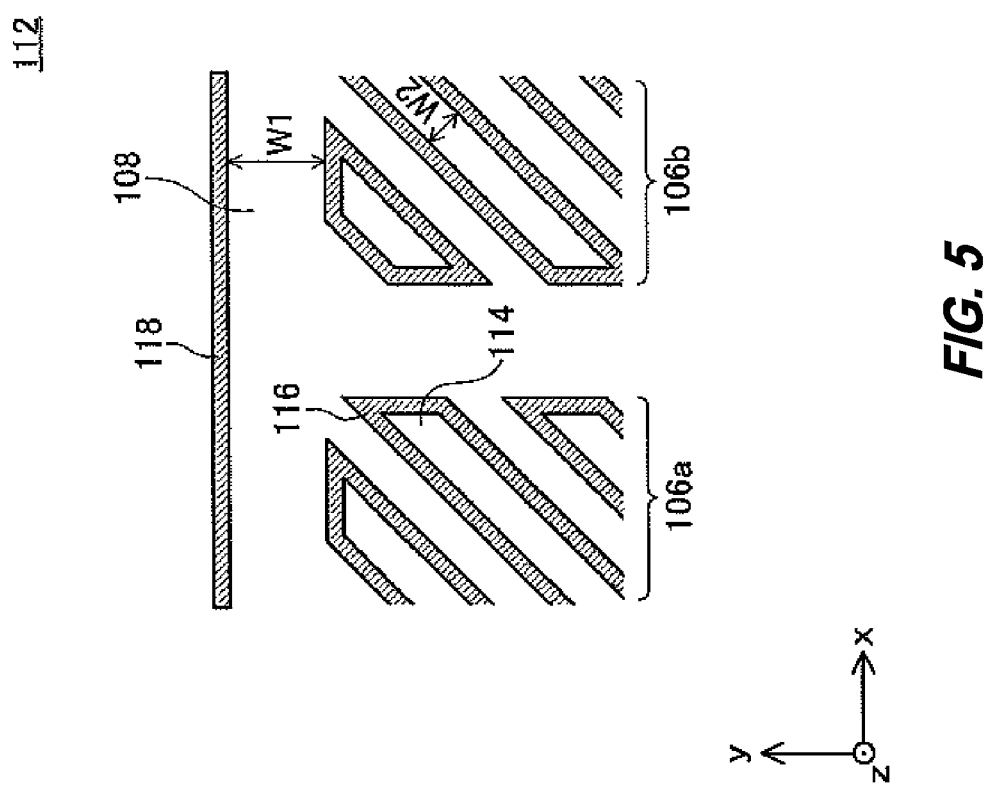
FIG. 5 is an enlarged cross-sectional view of a portion of FIG. 4 showing the section shown in a square 112 in FIG. 4

FIG. 5 is a plan view of an enlarged area 112 of FIG. 4. In the segment region 106, a plurality of core-patterns 114 are arranged periodically at given intervals with periodical grooves 116 formed around the core-patterns 114, respectively. These periodical grooves 116 are formed by so-called SADP technology. A single groove 118 is also formed as a rectangular frame-shaped groove encircling the segment regions 106a and 106b. A distance between the single groove 118 and each of the segment regions 106a and 106b is a width W1 approximately two times as large as the width W2 of each core-pattern 114.

In FIG. 5, the core-patterns 114 and the periodical grooves 116 are arranged at a diagonal to the x-axis (short-side direction of the segment region 106, i.e., first direction) and to the y-axis (long-side direction of the segment region 106, i.e., second direction). However, the periodical grooves 116 may be formed along the x-axis or along the y-axis.

Figure 1:
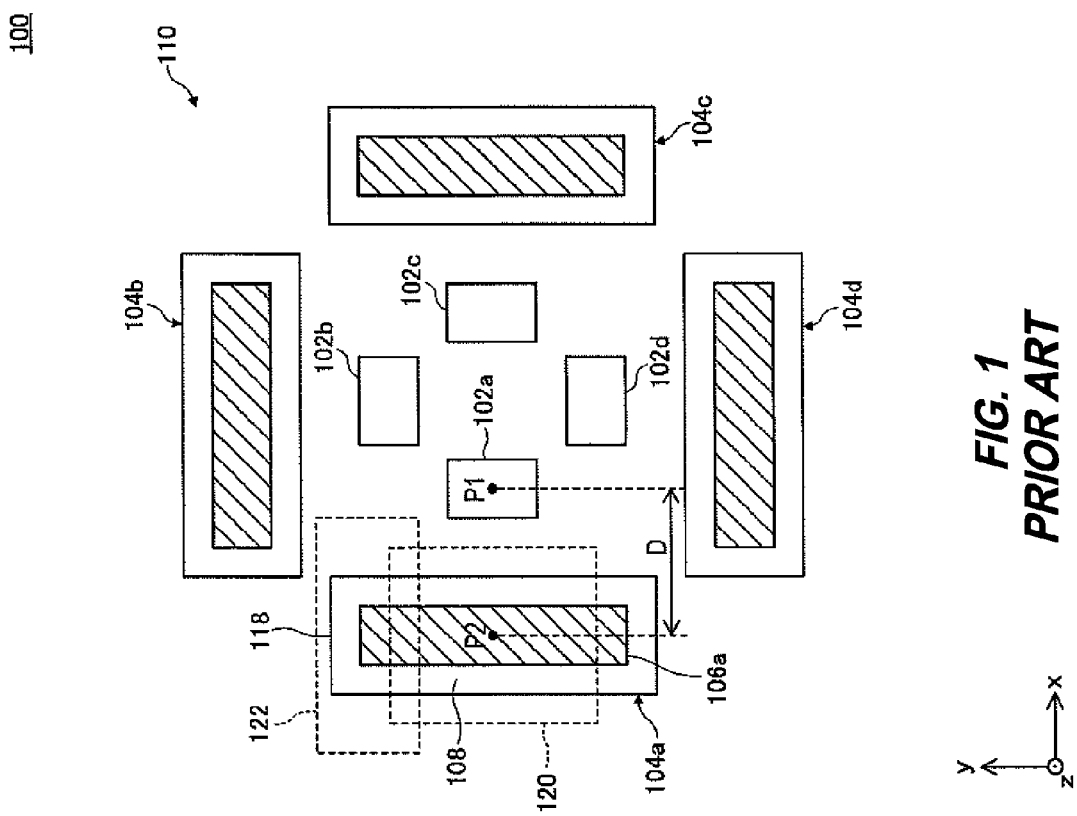
FIG. 1 is a plan view of a prior art.

FIG. 1 is a plan view of the overlay mark 110 in its prior art (comparison example). The overlay mark 110 of the prior art is different from the overlay mark 110 of the first embodiment in that one element set 104 includes only one segment region 106a. A problem with the overlay mark 110 of the prior art will first be described and then a solution to the problem provided by the overlay mark 110 of the first embodiment will be described.

To determine the midpoint P2, the measurement tool defines a measurement region 120 above the element set 104a. The measurement tool detects the positions of grooves present in the measurement region 120, thereby calculates the midpoint P2. In the case of SADP-based multi-patterning, the single groove 118 is so formed as to encircle the segment region 106, which is a set of the periodical grooves 116.

As far as the measurement procedure is concerned, the single groove 118 is actually unnecessary. It is therefore preferable that the measurement region 120 is defined as the region that does not include the single groove 118. However, the smallness of the width W1 of the pool region 108 (see FIG. 2) makes virtually impossible defining the measurement region 120 that includes two long sides of the segment region 106 (boundaries in the y direction) but does not include two long sides of the element set 104a (single groove 118). Increasing the width (length of the short-sides) of the segment region 106 is easy, but increasing the width W1 of the pool region 108 requires difficult processing. For this reason, the measurement region 120 is defined as the region that includes two segments of the single groove 118 and two boundaries (long sides) of the segment region 106a, as shown in FIG. 3.

Because the size of the upper level pattern 102 can be determined freely, it is not difficult for the measuring tool to detect two longish sides of the upper level pattern 102 and determine the midpoint P1. However, in the case of the element set 104, the measuring tool detects not only the two longish sides (boundaries) of the segment region 106 but also two segments of the single groove 118. This renders calculation of the midpoint P2 difficult.

Figure 2:
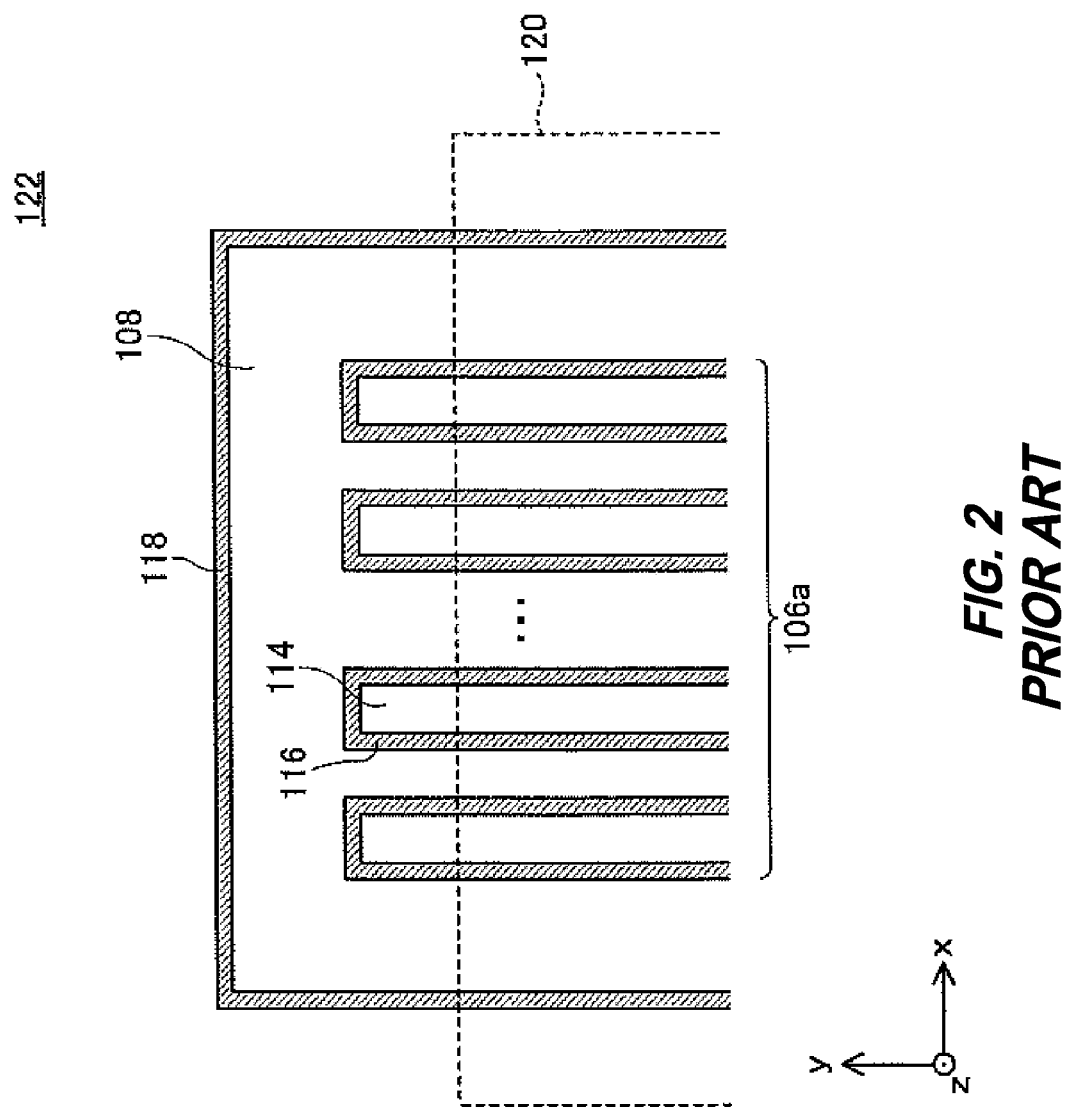
FIG. 2 is an enlarged plan view of the FIG. 1.

FIG. 2 is a plan view (prior art) of an enlarged area 122 of FIG. 1. In the segment region 106, the plurality of core-patterns 114 are formed periodically with the periodical grooves 116 formed around the core-patterns 114, respectively, in the same manner as in FIG. 5. FIG. 2 depicts the core-patterns 114 extending in the x direction. The core-patterns 114, however, may extend diagonally or in the y direction. The segment region 106 is encircled with a rectangular frame-shaped area formed by the single groove 118.

Figure 3:
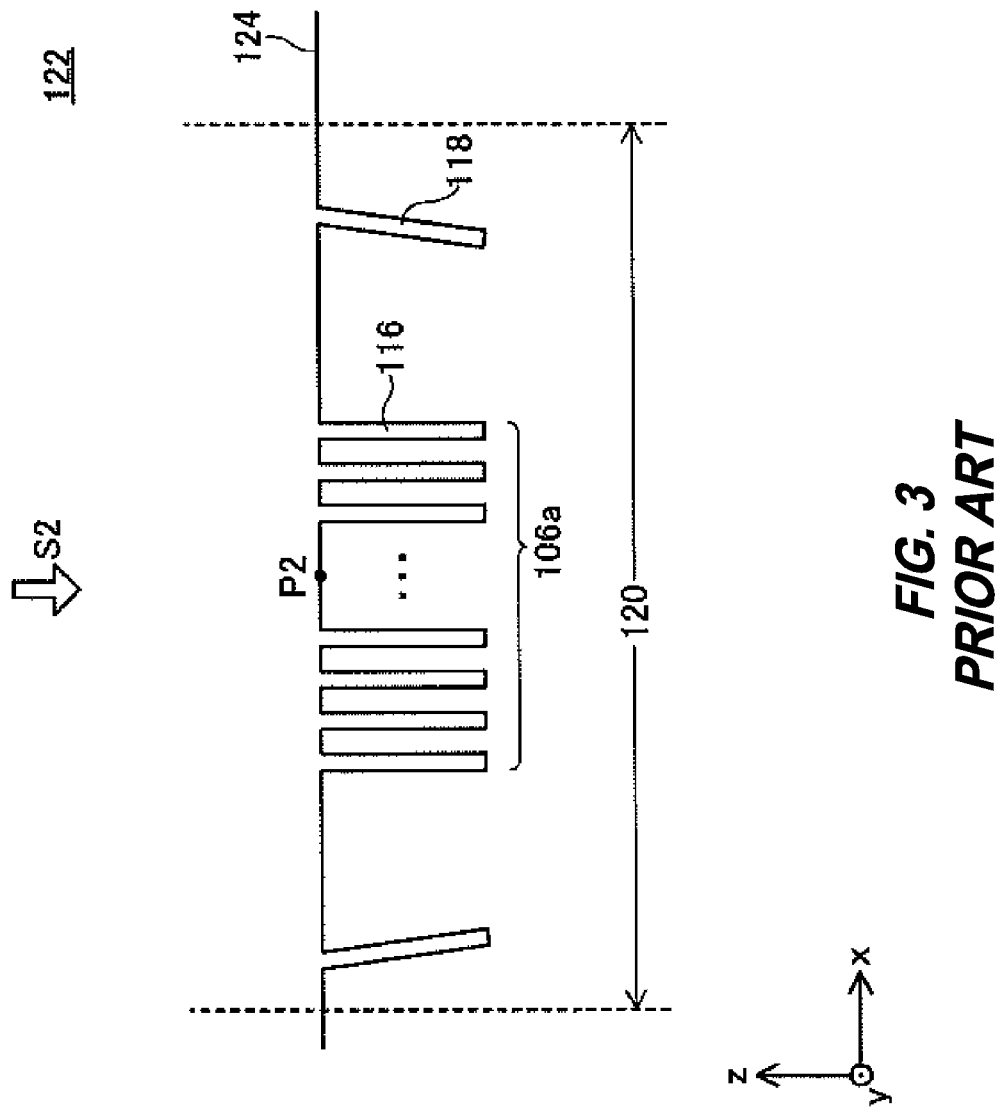
FIG. 3 is a cross-sectional view of the FIG. 2.

FIG. 3 is a sectional view (prior art) of the enlarged area 122 of FIG. 1. As shown in FIG. 3, the periodical grooves 116 and the single groove 118 are formed on a semiconductor substrate 124. While the periodical grooves 116 formed periodically at fixed intervals extend in the vertical direction (z-axis direction), the single groove 118 having no groove in close proximity thereto tends to incline, as shown in FIG. 3. This makes difficult identifying the position (x coordinates) of the single groove 118 in the measurement region 120 from a graphic image (image captured in a direction S2), thus leading to difficulty in exact measurement of the midpoint P2. In addition, because the outermost periodical groove 116 in the segment region 106a is so close to the single groove 118, identifying the positions of long sides (boundaries) of the segment region 106a is also difficult.

Figure 6:
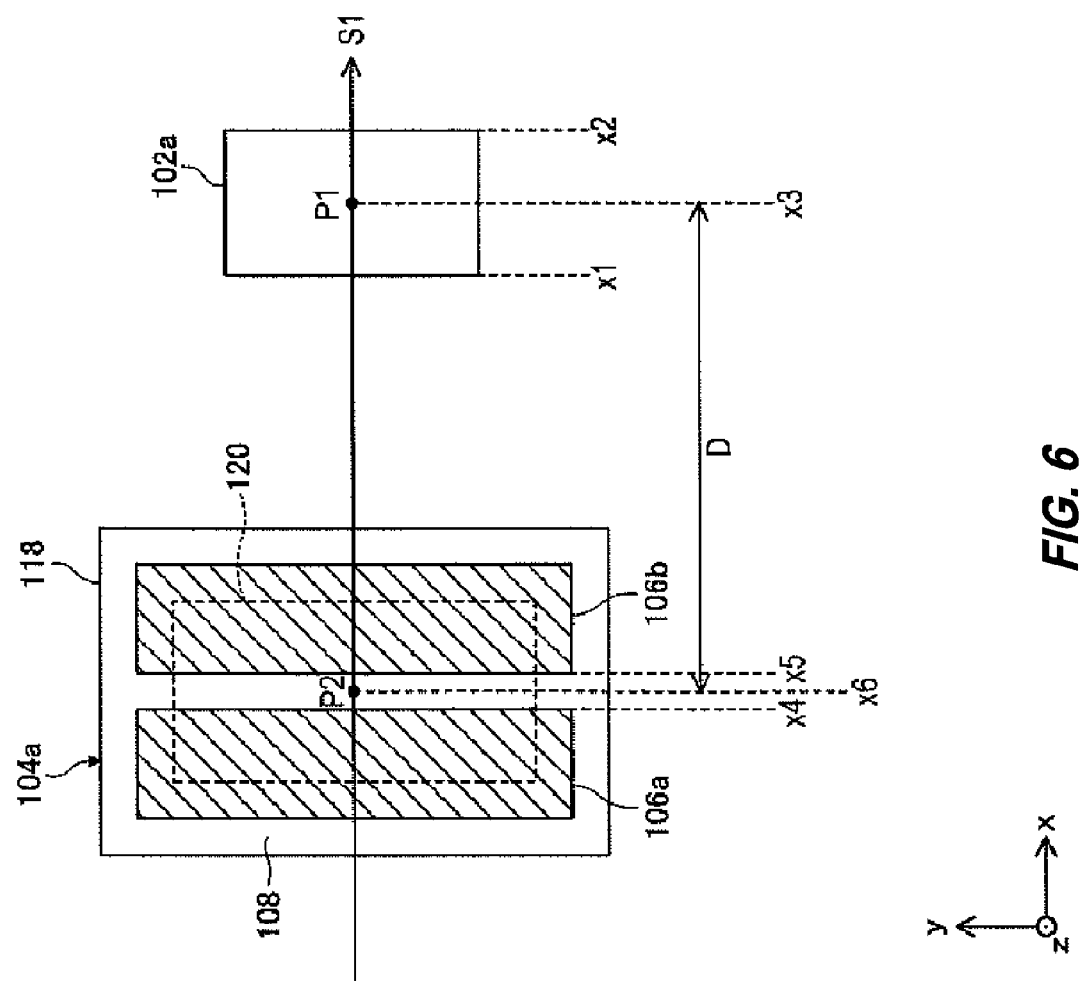
FIG. 6 is a plan view of a portion of the FIG. 4.

FIG. 6 is an enlarged plan view for explaining a method of measuring the overlay mark according to the first embodiment. According to the first embodiment, the element set 104a includes two segment regions 106a and 106b. As described above, adjusting the size (length of the short sides) of the segment region 106 is easy. In the first embodiment, because the two segment regions 106a and 106b are arranged in the x-axis direction, the long sides of the measurement region 120 can be located in the segment regions 106a and 106b. In other words, the measurement region 120 can be defined as the region that does not include the single groove 118.

The measurement tool detects the x coordinates x1 and x2 of two long sides of the upper level pattern 102a and calculates the x coordinates x3 of the midpoint P1. The measurement tool also detects the x coordinate X4 of the right long side of the segment region 106a and the x coordinate X5 of the left long side of the segment region 106b, thereby calculates the x coordinates x6 of the midpoint P2. Since the single groove 118 is not included in the measurement region 120, the midpoint P2 can be determined accurately.

Figure 7:
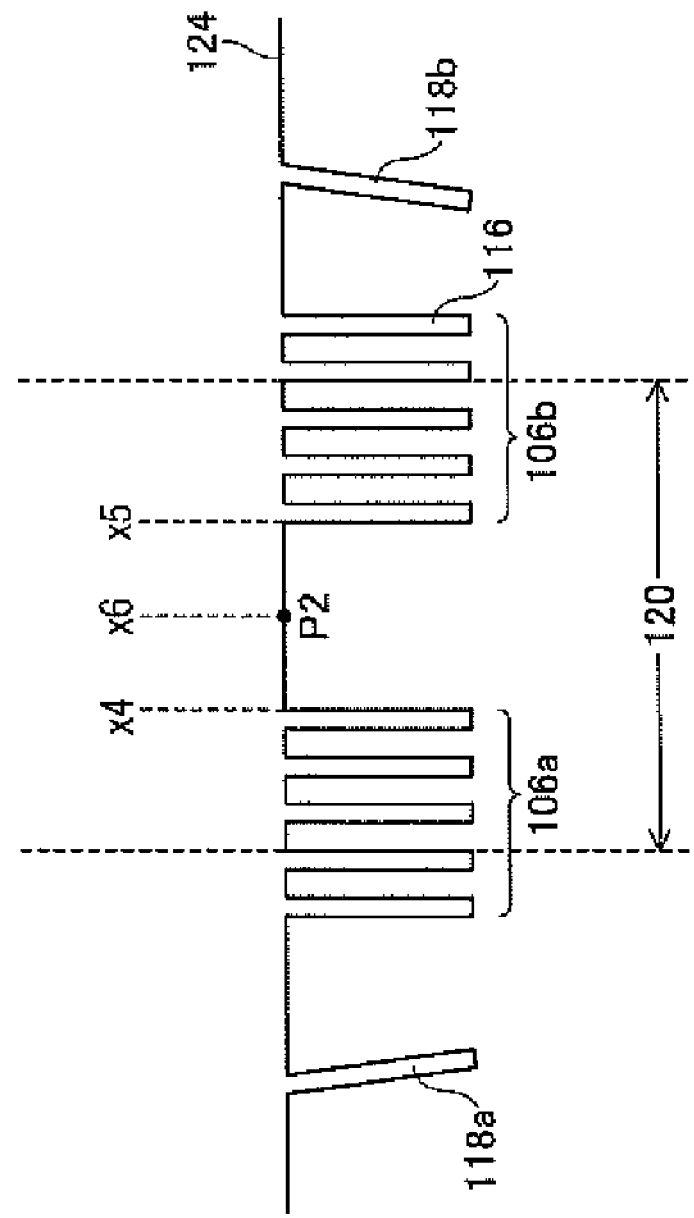
FIG. 7 is an enlarged cross-sectional view of a portion of FIG. 6 showing the section shown in a square 120 in FIG. 6.

FIG. 7 is an enlarged sectional view of the periphery of the measurement region 120. In the x direction, a single groove 118a (first single groove), the segment region 106a (a group of the periodical grooves 116, i.e., first group), the segment region 106b (a group of the periodical grooves 116, i.e., second group), and a single groove 118b (second single groove) are arranged in that order. The measurement region 120 is defined as the region extending from the middle of the segment region 106a to the middle of the segment region 106b. The large distance between the single groove 118a and the segment region 106a, the fixed distance between the segment region 106a and the segment region 106b, and the large distance between the segment region 106b and the single groove 118b are all the same. The large distance may be more than the fixed distance.

A process of forming the element set 104 will then be described, referring to FIGS. 8 to 20.

Figure 8:
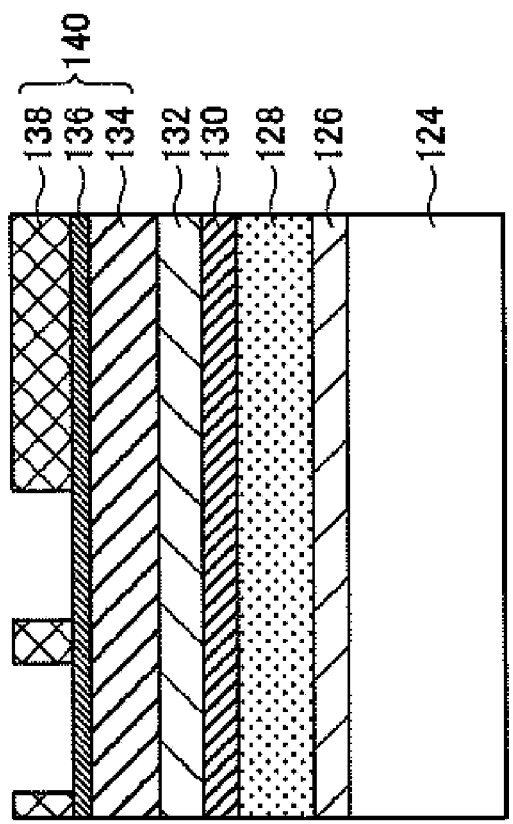

First, as shown in FIG. 8, a silicon oxide layer (LPCVD-TEOS layer 126) is formed on the semiconductor substrate 124 (silicon substrate), using TEOS (tetraethoxysilane) as the precursor, by LPCVD. Layers of amorphous carbon 128(a-C), plasma silicon nitride 130(p-SiN), and plasma silicon oxide 132(p-SiO) are then formed in order on the LP-TEOS layer 126. These layers make up a hard mask whose layer structure is determined arbitrarily. An MLR 140 (Multi Layer Resist) is additionally formed on this hard mask, the MLR 140 including a first bottom anti-reflection layer 134 (first BARC), an organic coating layer containing silicon 136 (Bottom Layer Resist: BLR), and a first photoresist 138. Subsequently, the first photoresist 138 is developed into line-shaped patterns.

Figure 9:
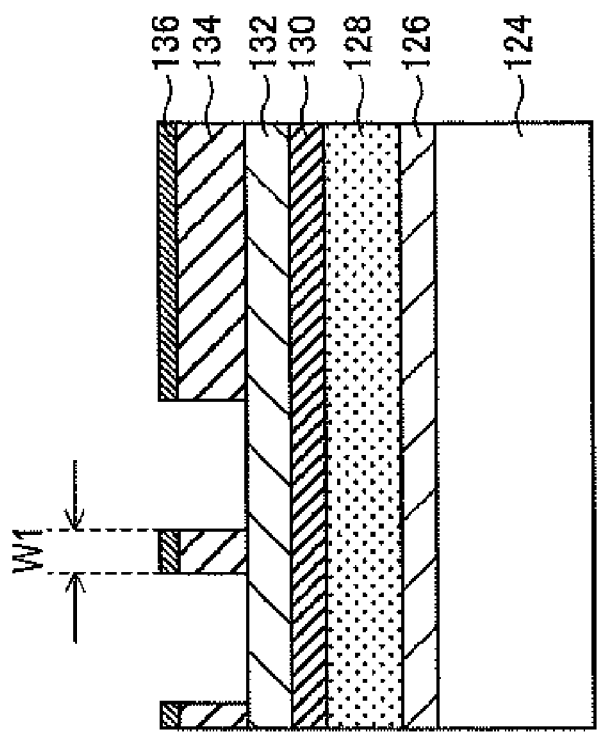
FIGS. 8-20 are cross-sectional views of an embodiment of an intermediate overlay mark of the invention during various step of fabrication process flow.

Subsequently, as shown in FIG. 9, the organic coating layer containing silicon 136 and the first bottom anti-reflection layer 134 are etched, using remaining portions of first photoresist 138 as a mask, to form core patterns having the width W1.

Figure 10:
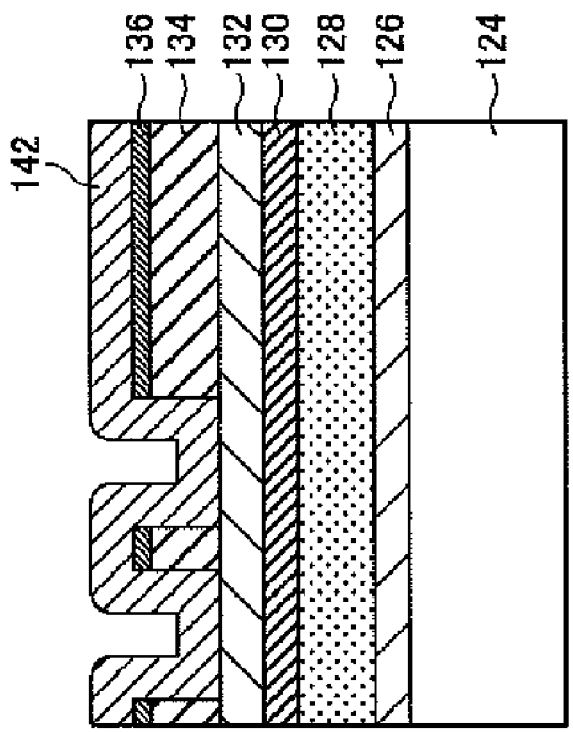

A sacrifice layer 142 of 40 nm in thickness is then formed, as shown in FIG. 10. As a result, gaps (depressions) having a width nearly equal to the width W1 is formed. The width of grooves formed on the semiconductor substrate 124 can be controlled by adjusting the thickness of the sacrifice layer 142. Reducing the thickness of the sacrifice layer 142 allows the formation of grooves having a width equal to or smaller than a minimum width achieved by the resolution limit of the photolithographic technology.

Figure 11:
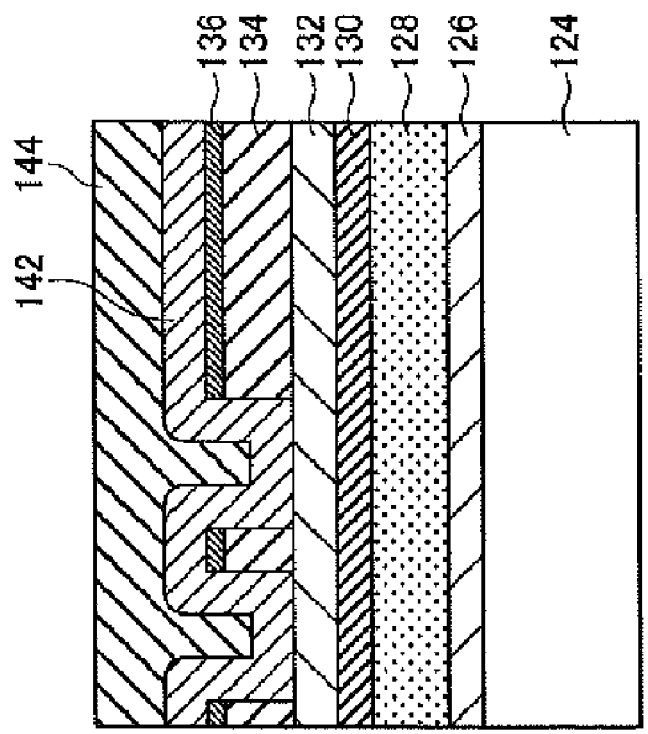

Subsequently, as shown in FIG. 11, a second bottom anti-reflection layer 144 (second BARC film) is overlaid on the sacrifice layer 142 to plug the formed depressions with the second bottom anti-reflection layer 144. The second bottom anti-reflection layer 144 is made of the same material as the material making up the first anti-reflection layer 134.

Figure 12:
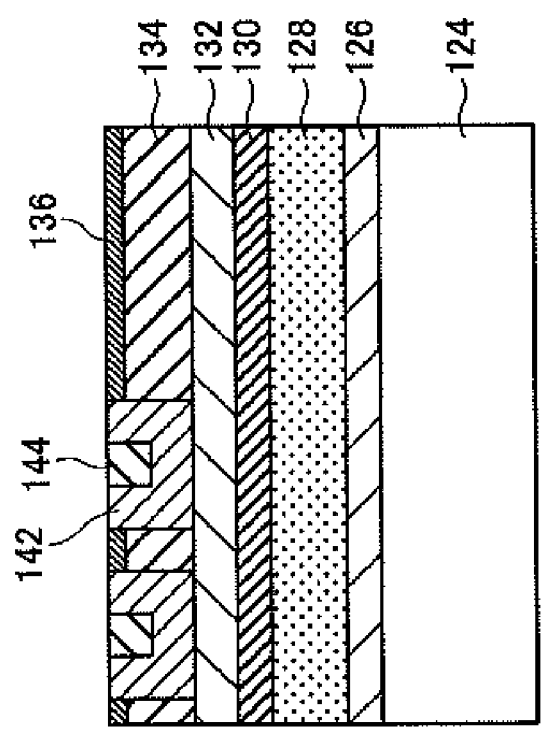

Subsequently, as shown in FIG. 12, the second bottom anti-reflection layer 144 and the sacrifice layer 142 are so etched that the organic coating layer containing silicon 136 is exposed. As a result of this etching, the surfaces of the organic coating layer containing silicon 136, sacrifice layer 142, and second bottom anti-reflection layer 144 are exposed simultaneously.

The total thickness of the organic coating layer containing silicon 136 and first bottom anti-reflection layer 134 must be larger than the thickness of the sacrifice layer 142. This is essential to ensure that when the second bottom anti-reflection layer 144 and the sacrifice layer 142 are etched in the above manner, the portion of second bottom anti-reflection layer 144 filled in the depressions of the sacrifice layer 142 is kept intact as a mask pattern.

Figure 13:
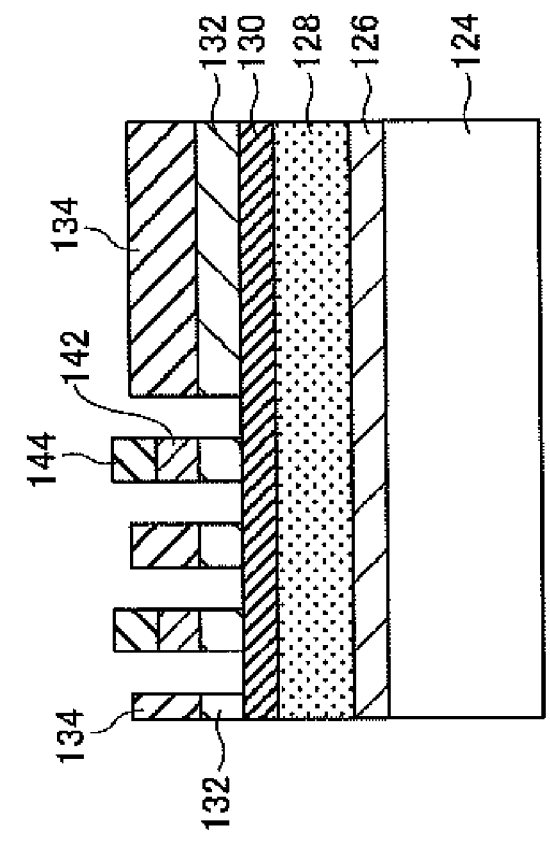

As shown in FIG. 13, the sacrifice layer 142 is etched selectively, using the organic coating layer containing silicon 136 and second bottom anti-reflection layer 144 as a mask, and the plasma silicon oxide 132 with its upper surface exposed is also etched. These etching processes eliminate the organic coating layer containing silicon 136. Depressions resulting from the etching make up the word-line structure in a memory cell region or serve as grooves of the element set 104.

Figure 14:
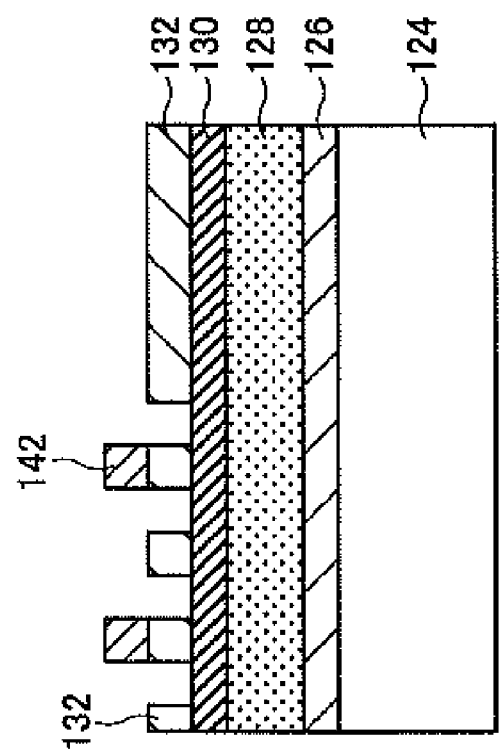

As shown in FIG. 14, the first bottom anti-reflection layer 134 and the second bottom anti-reflection layer 144 are removed selectively.

Figure 15:
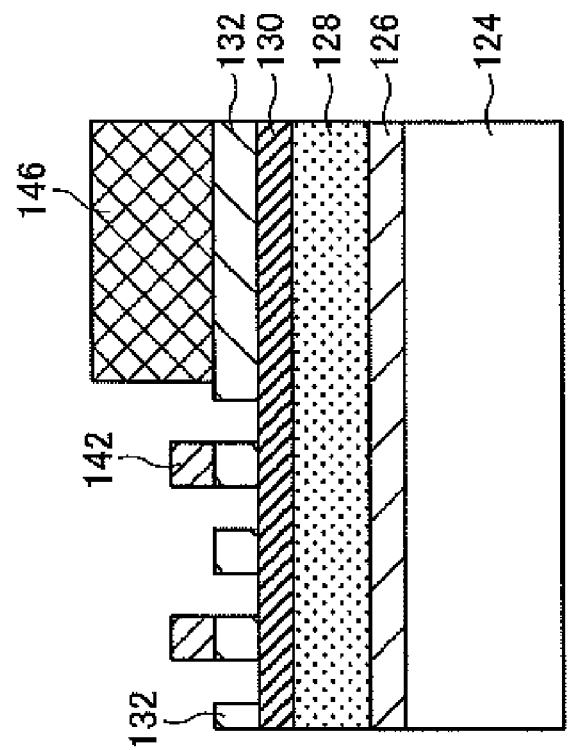

Then, as shown in FIG. 15, a second photoresist 146 is formed while a region in which grooves are to be formed is secured.

Figure 16:
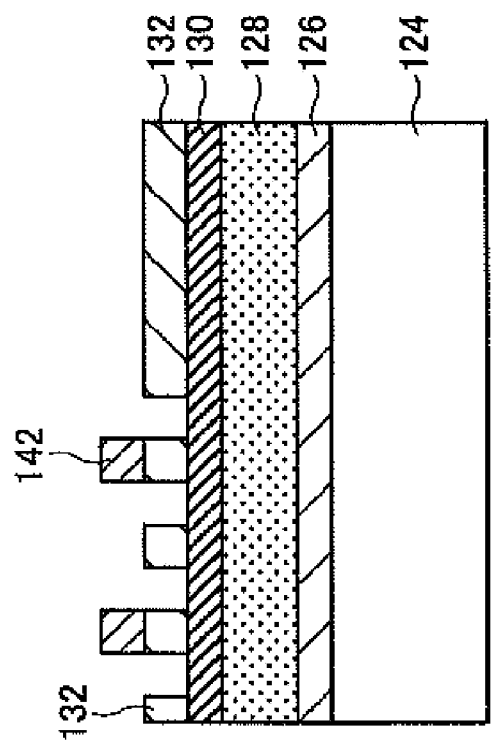

As shown in FIG. 16, the plasma silicon nitride 130 with its upper surface exposed is etched, using the plasma silicon oxide 132, etc., as a mask. This etching should preferably be carried out as over-etching by which the surface of the amorphous carbon layer 128 is surely exposed.

Figure 17:
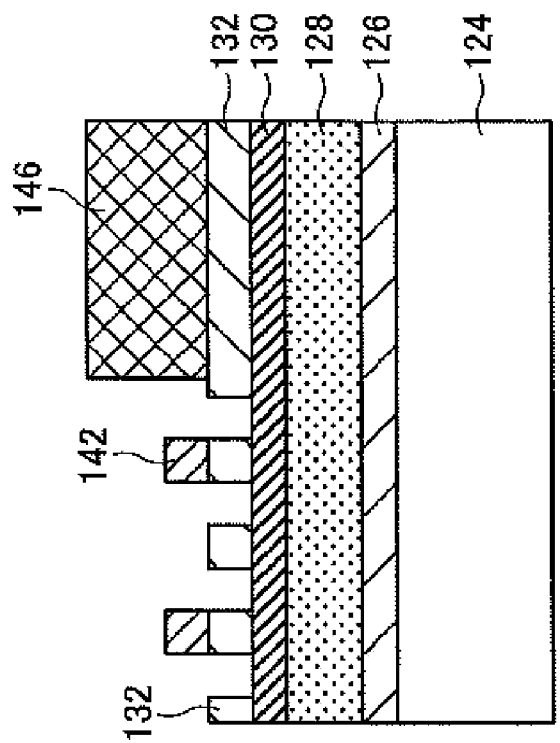

Subsequently, as shown in FIG. 17, the exposed amorphous carbon layer 128 is ashed by oxygen plasma, which removes the second photoresist 146 at the same time.

Figure 18:
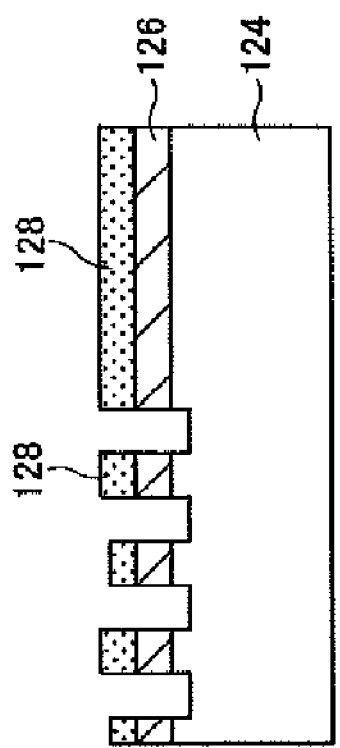

Subsequently, as shown in FIG. 18, the LPCVD-TEOS layer 126 under the amorphous carbon layer 128 is etched, at which the plasma silicon nitride 130 and the plasma silicon oxide 132 are removed by etching. As a result, the surface of the semiconductor substrate 124 is exposed. This etching should preferably be carried out as over-etching so that the surface of the semiconductor substrate 124 is surely exposed.

Figure 19:
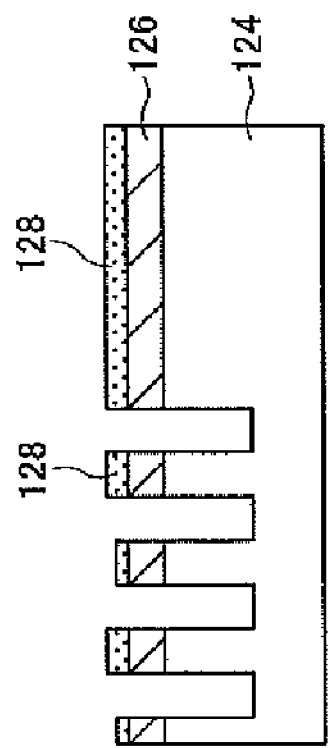

Subsequently, as shown in FIG. 19, the semiconductor substrate 124 under the LP-TEOS layer 126 is etched, using the LPCVD-TEOS layer 126 and amorphous carbon layer 128 as a mask. As a result, grooves having a given depth in the vertical direction of FIG. 19 are formed.

Figure 20:
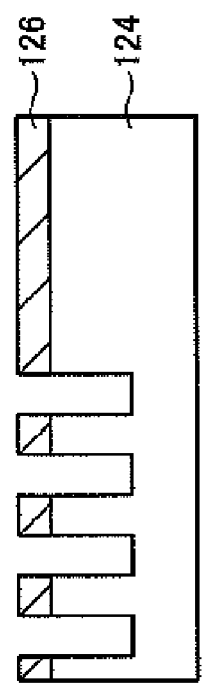

Finally, the amorphous carbon layer 128 used as a part of the mask is removed. Hence grooves with the identical width are formed at the identical interval while the LPCVD-TEOS layer 126 is left as it is (FIG. 20).

Afterward, the grooves may be filled with a gate electrode material to form the word-line structure. On the semiconductor substrate, an intermediate insulating layer (not depicted) is also formed to compose a bit-line contact. After the formation of several lines and several contacts, a passivation film is formed. Filling the grooves of the semiconductor substrate 124 with an insulating film composes an STI (shallow trench isolation) region. When a bit-line pattern is formed on the intermediate insulating layer, the upper level pattern 102 is formed in the photoresist for bit-line patterning, and this upper level pattern 102 is aligned with the element set 104, as described above.

Figure 21:
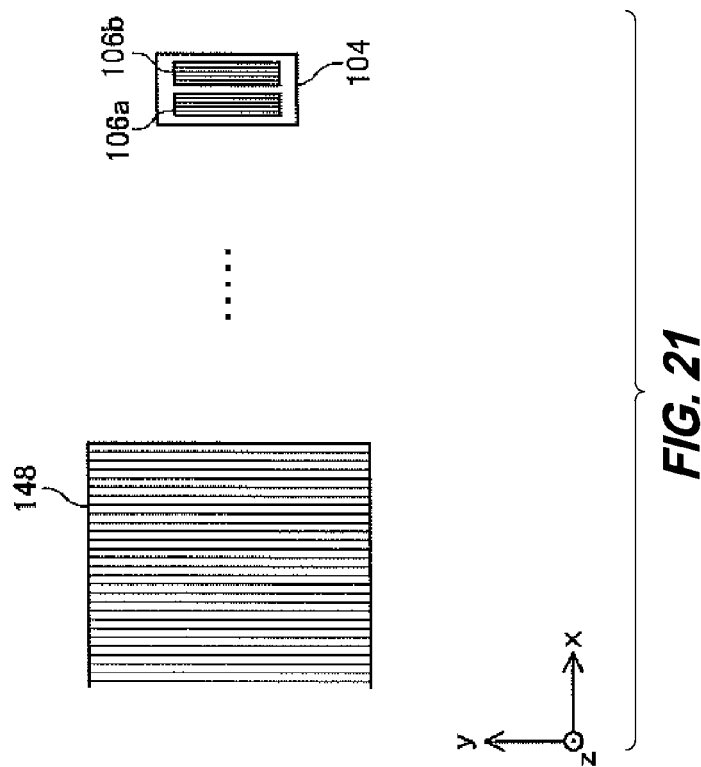
FIG. 21 is a plan view of a memory cell area and a portion of the overlay mark, in the semiconductor device in accordance with an embodiment of the invention.

FIG. 21 is a plan view of a memory cell region 148 and the element set 104. The memory cell region 148 includes a plurality of word lines. The periodical grooves 116 included in the segment regions 106a and 106b of the element set 104 extend in the same direction as the word lines of the memory cell region 148 and are formed by the same process as the manufacturing process for the word lines. Four overlay marks 110 corresponding to four sides of the memory cell region 148 may be formed. The overlay mark 110 may be formed on the boundary of each semiconductor device 100, i.e., dicing area.

Figure 22:
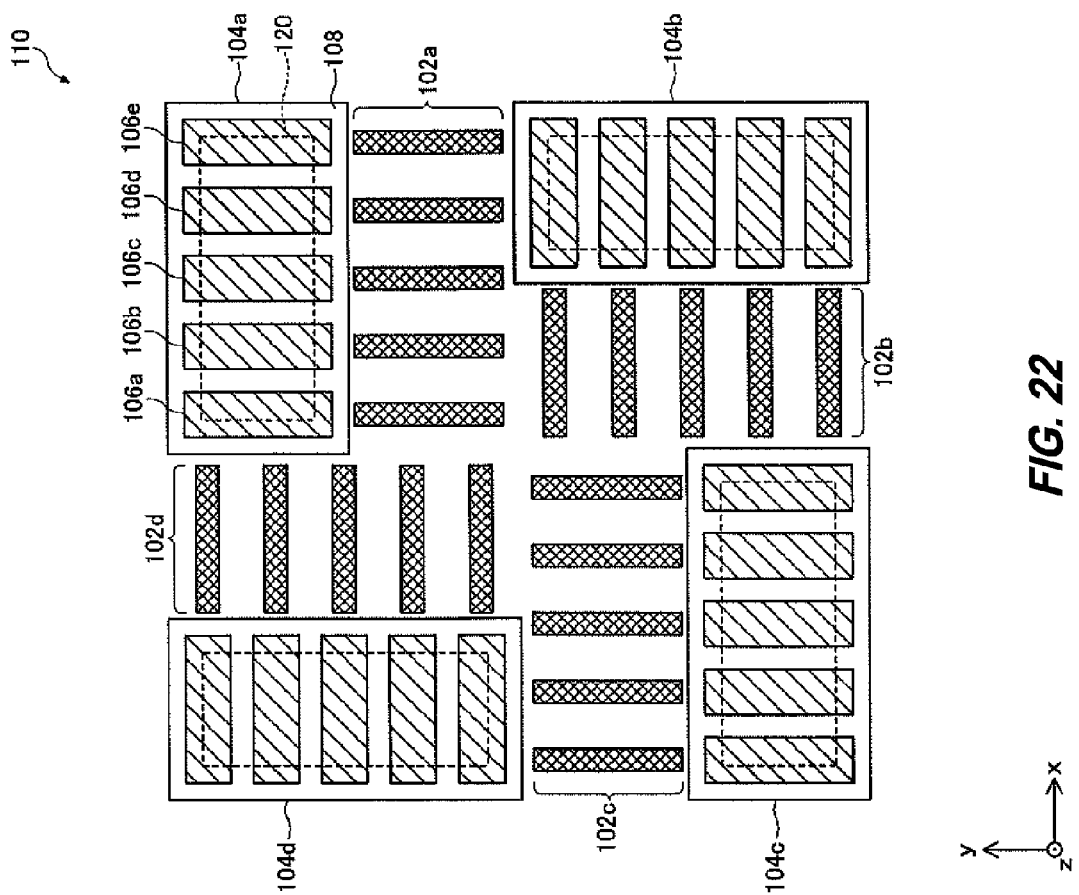
FIG. 22 is a plan view of an overlay mark in the semiconductor device in accordance with another embodiment of the invention.

FIG. 22 is a plan view of the overlay mark 110 formed on the semiconductor device 100 according to a second embodiment. The overlay mark 110 of the second embodiment is a so-called AIM mark. The overlay mark 110 of the second embodiment includes the element sets 104a to 104d and the upper level patterns 102a to 102d formed temporarily in the photoresist that is an upper layer to the element sets 104a to 104d.

The upper level patterns 102a and 102d are formed in the photoresist, as rectangular areas and are so arranged that the upper level patterns 102 adjacent to each other are at right angles with each other, as shown in FIG. 22. The element set 104a of the second embodiment is the rectangular area with long sides extending in the x direction, and includes five segment regions 106a to 106e with long sides extending in the y direction. The element set 104a is a mark corresponding to the upper level pattern 102a. The other element sets 104b to 104d correspond to the upper level pattern 102b to 102d, and have the same structure as the element set 104a. One element set 104 includes two or more segment regions 106 of which the number is determined arbitrarily.

The measurement tool scans in the x-negative direction to detect the midpoint of the element set 104a and the midpoint of the upper level pattern 102a, measures the distance between both midpoints, thereby detects the misalignment of the upper level pattern 102 and the segment region 106.

Preferred embodiments of the present invention have been described. The present invention is not limited to the above embodiments and may be modified into various modes on the condition that the modified modes do not deviate from the substance of the invention. Obviously, the modified modes are included in the scope of the invention.

What is claimed is:

1. A semiconductor device comprising:
   at least two segment regions spaced from one another by a first distance, each of the at least two segment regions including a plurality of first grooves spaced from one another by a second distance that is smaller than the first distance;
   a second groove spaced from and encircling the at least two segment regions, the second groove being spaced from each of the at least two segment regions by a third distance that is larger than the second distance, the second groove comprising longitudinally elongated straight segments; and
   the first grooves comprising longitudinally elongated straight segments that are parallel one another and are angled non-orthogonally relative to all of the longitudinally elongated straight segments of the second groove.

2. The semiconductor device according to claim 1, wherein the third distance is no less than the first distance.

3. The semiconductor device according to claim 2, further comprising a semiconductor substrate, wherein each of the first and second grooves is disposed in the semiconductor substrate.

4. The semiconductor device according to claim 1, further comprising:
   a memory cell area;
   a word groove extending parallel and disposed in the memory cell area; and
   a word-line disposed in the word groove.

5. The semiconductor device according to claim 1, wherein said longitudinally elongated straight segments of the first grooves are angled 45° from all of the longitudinally elongated straight segments of the second groove.

6. The semiconductor device according to claim 1, wherein the second groove forms an elongated rectangular shape and each of the at least two elongated segments regions form an elongated rectangular shape.

7. The semiconductor device according to claim 6, comprising five of said elongated segments within said rectangular shape of the second groove.

8. The semiconductor device according to claim 6, wherein the elongated rectangular shapes of the at least two elongated segments are each parallel one another and orthogonal to the elongated shape of the second groove.

9. The semiconductor device according to claim 8, comprising five of said elongated segments within said rectangular shape of the second groove.

10. A semiconductor device comprising:
    a first groove;
    a first set of second grooves, which is apart from the first groove with a first distance, the second grooves being arranged periodically with a second distance that is smaller than the first distance;
    a second set of third grooves, which is apart from the first set with a third distance that is larger than the second distance, the third grooves being arranged periodically with a fourth distance that is substantially equal to the second distance; and
    a fourth groove that is apart from the second set with a fifth distance that is larger than the second distance.

11. The semiconductor device according to claim 10, wherein each of the first groove and the fourth groove extends in a first direction.

12. The semiconductor device according to claim 11, wherein each of the second grooves and the third grooves, respectively, included in each of the first and second sets, extends in a second direction that is substantially parallel to the first direction.

13. The semiconductor device according to claim 5, wherein each of the second grooves and the third grooves, respectively, included in each of the first and second sets, extends in a second direction intersecting with the first direction.

14. The semiconductor device according to claim 10, further comprising an insulating layer, wherein the insulating layer includes:
    the first groove;
    the second grooves included in the first set;
    the third grooves included in the second set; and
    the fourth groove.

15. The semiconductor device according to claim 10, further comprising a conductive material and an inter-layer dielectric, wherein the conductive material is disposed in:
    the first groove disposed in the inter-layer dielectric;
    the first set of the second grooves disposed in the inter-layer dielectric;
    the second set of the third grooves disposed in the inter-layer dielectric; and
    the fourth groove disposed in the inter-layer dielectric.

16. The semiconductor device according to claim 10, further comprising a third set of fifth grooves which is disposed between the first and second sets, the third set being apart from each of the first and second sets with a sixth distance that is substantially equal to the third distance.

* * * * *

UNITED STATES PATENT AND TRADEMARK OFFICE
CERTIFICATE OF CORRECTION

PATENT NO. : 9,355,923 B2
APPLICATION NO. : 14/523056
DATED : May 31, 2016
INVENTOR(S) : Hiroshi Yoshino It is certified that error appears in the above-identified patent and that said Letters Patent is hereby corrected as shown below:

In the claims,

Col. 8, line 35, claim 13, please delete "claim 5" after "according to" and insert --claim 11--.

Signed and Sealed this
Ninth Day of August, 2016

Michelle K. Lee
*Director of the United States Patent and Trademark Office*